(12) United States Patent  
Wang et al.

(10) Patent No.: US 11,239,216 B2  
(45) Date of Patent: Feb. 1, 2022

(54) TRANSPARENT DISPLAY PANEL AND TRANSPARENT DISPLAY

(71) Applicant: BOE TECHNOLOGY GROUP CO., LTD., Beijing (CN)

(72) Inventors: Ling Wang, Beijing (CN); Yicheng Lin, Beijing (CN); Ying Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/860,259

(22) Filed: Apr. 28, 2020

(65) Prior Publication Data

US 2021/0066259 A1 Mar. 4, 2021

(30) Foreign Application Priority Data

Aug. 30, 2019 (CN) .......................... 201910818492.8

(51) Int. Cl.
*H01L 27/14* (2006.01)
*H01L 25/075* (2006.01)
*H01L 27/12* (2006.01)
*H01L 29/786* (2006.01)

(52) U.S. Cl.
CPC ........ *H01L 25/0753* (2013.01); *H01L 27/124* (2013.01); *H01L 27/1225* (2013.01); *H01L 27/1255* (2013.01); *H01L 29/7869* (2013.01); *H01L 29/78672* (2013.01)

(58) Field of Classification Search
CPC ............ H01L 25/0753; H01L 27/1225; H01L 27/1255; H01L 27/124; H01L 29/78672; H01L 29/7869

USPC ....................................................... 257/43, 59
See application file for complete search history.

(56) References Cited

U.S. PATENT DOCUMENTS

| 10,325,893 | B2 * | 6/2019 | Chong | ................ | H01L 33/0093 |
| 2019/0335553 | A1 * | 10/2019 | Ahmed | ............... | G02B 3/0018 |
| 2019/0363127 | A1 * | 11/2019 | Wu | ....................... | H01L 25/167 |
| 2020/0357871 | A1 * | 11/2020 | Chung | ................ | H01L 51/5284 |

FOREIGN PATENT DOCUMENTS

| CN | 106057843 A | 10/2016 |
| CN | 106843398 A | 6/2017 |
| CN | 106932989 A | 7/2017 |
| CN | 107247356 A | 10/2017 |
| CN | 107331741 A | 11/2017 |

(Continued)

OTHER PUBLICATIONS

Office Action dated Feb. 10, 2021 in Chinese Application No. 201910818492.8, with English Translation.

*Primary Examiner* — Tan N Tran

(74) *Attorney, Agent, or Firm* — McDermott Will and Emery LLP

(57) ABSTRACT

A transparent display panel includes a base and a plurality of sub-pixels disposed on the base. Each sub-pixel includes a light-emitting unit, and a light transmission portion disposed on at least one side of the light-emitting unit. The light-emitting unit includes at least one Micro-LED and a control circuit connected to the Micro-LED. The control circuit is configured to drive the at least one Micro-LED to emit light. The light transmission portion includes at least one of a transparent insulating portion or an opening.

9 Claims, 5 Drawing Sheets

(56) References Cited

FOREIGN PATENT DOCUMENTS

| CN | 107657900 A | 2/2018 |
| CN | 107946341 A | 4/2018 |
| CN | 207338380 U | 5/2018 |
| CN | 109300951 A | 2/2019 |
| CN | 109523913 A | 3/2019 |

* cited by examiner

TRANSPARENT DISPLAY PANEL AND TRANSPARENT DISPLAY

CROSS-REFERENCE TO RELATED APPLICATION

This application claims priority to Chinese Patent Application No. 201910818492.8 filed on Aug. 30, 2019, which is incorporated herein by reference in its entirety.

TECHNICAL FIELD

The present disclosure relates to the field of display technologies, and in particular, to a transparent display panel and a transparent display.

BACKGROUND

A transparent display is a display that allows viewers to see both the image displayed by the display and the scene behind the display. The transparent display can be applied in vehicle window, shop window, and other display scenes such as augmented reality (AR) and virtual reality (VR).

SUMMARY

In one aspect, a transparent display panel is provided. The transparent display panel includes a base and a plurality of sub-pixels disposed on the base. Each sub-pixel includes a light-emitting unit and a light transmission portion disposed on at least one side of the light-emitting unit. The light-emitting unit includes at least one micro light-emitting diode (Micro-LED) and a control circuit connected to the at least one Micro-LED. The control circuit is configured to drive the at least one Micro-LED to emit light. The light transmission portion includes at least one of a transparent insulating portion or an opening.

In some embodiments, an area of an orthographic projection of the light transmission portion on the base is is equal to or greater than an area of an orthographic projection of the light-emitting unit on the base.

In some embodiments, the area of the orthographic projection of the light transmission portion on the base is one to three times of the area of the orthographic projection of the light-emitting unit on the base.

In some embodiments, the transparent display panel further includes at least one insulating layer disposed on the base. Materials of the base and the at least one insulating layer are transparent inorganic insulating materials. The light transmission portion is the transparent insulating portion composed of a portion of the at least one insulating layer.

In some embodiments, the transparent display panel further includes at least one insulating layer disposed on the base. The at least one insulating layer includes at least one organic insulating layer. The at least one organic insulating layer includes a plurality of openings each disposed in a respective one of the plurality of sub-pixels. The light transmission portion includes a corresponding opening.

In some embodiments, the at least one insulating layer further includes at least one inorganic insulating layer, and materials of the base and the at least one insulating layer are transparent inorganic insulating materials. The light transmission portion further includes the transparent insulating portion composed of a portion of the at least one inorganic insulating layer.

In some embodiments, the transparent display panel further includes at least one insulating layer disposed on the base. The at least one insulating layer includes a plurality of openings each disposed a respective one of the plurality of sub-pixels. The light transmission portion is composed of a corresponding opening.

In some embodiments, the transparent display panel further includes a plurality of metal wires disposed in at least one layer between the at least one Micro-LED and the base. An orthographic projection of the plurality of metal wires on the base does not overlap the orthographic projection of the light transmission portion on the base.

In some embodiments, the control circuit includes at least one of an oxide thin film transistor or a low temperature poly-silicon thin film transistor.

In some embodiments, the control circuit includes a switching transistor, a driving transistor, and a capacitor. A gate of the switching transistor is electrically connected to a scanning signal line, a first electrode of the switching transistor is electrically connected to a data signal line, and a second electrode of the switching transistor is electrically connected to a first electrode of the capacitor. A gate of the driving transistor is electrically connected to the first electrode of the capacitor, a first electrode of the driving transistor is electrically connected to a first voltage terminal, and a second electrode of the driving transistor is electrically connected to a first electrode of a corresponding Micro-LED. A second electrode of the capacitor is electrically connected to the first voltage terminal.

In some embodiments, each Micro-LED includes: a P-type semiconductor layer, a light-emitting layer, and an N-type semiconductor layer which are sequentially stacked. Each Micro-LED further includes a first electrode in contact with the P-type semiconductor layer and a second electrode in contact with the N-type semiconductor layer.

In another aspect, a transparent display is provided. The transparent display includes the transparent display panel as described above.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and for a person of ordinary skill in the art, other drawings may be obtained according to these drawings without paying any creative effort.

DETAILED DESCRIPTION

Technical solutions in some embodiments of the present disclosure will be described clearly and completely with reference to the accompanying drawings in the embodiments of the present disclosure. Obviously, the described embodiments are merely some but not all of embodiments of the present disclosure. All other embodiments obtained based on the embodiments of the present disclosure by a person of ordinary skill in the art without paying any creative effort shall be included in the protection scope of the present disclosure.

Unless the context requires otherwise, the term "comprise" and other forms thereof such as the third-person singular form "comprises" and the present participle form "comprising" in the specification and the claims are construed as an open and inclusive meaning, i.e., "included, but not limited to". In the description of the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

The terms such as "first" and "second" are only used for descriptive purposes and cannot be construed as indicating or implying the relative importance or implicitly indicating the number of indicated technical features below. Thus, features defined as "first" or "second" may explicitly or implicitly include one or more of the features. In the description of the embodiments of the present disclosure, the term "a/the plurality of" means two or more unless otherwise specified.

In the description of some embodiments, the expressions "coupled" and "connected" and their extensions may be used. For example, term "connected" may be used in the description of some embodiments to indicate that two or more components are in direct physical or electrical contact with each other. For another example, term "coupled" may be used in the description of some embodiments to indicate that two or more components are in direct physical or electrical contact. However, terms such as "coupled" may also mean that two or more components are not in direct contact with each other but still cooperate or interact with each other. The embodiments disclosed herein are not necessarily limited to the contents herein.

"At least one of A, B, and C" has a same meaning as "at least one of A, B, or C", and both include the following combinations of A, B, and C: only A, only B, only C, a combination of A and B, a combination of A and C, a combination of B and C, and a combination of A, B, and C.

Figure 1:
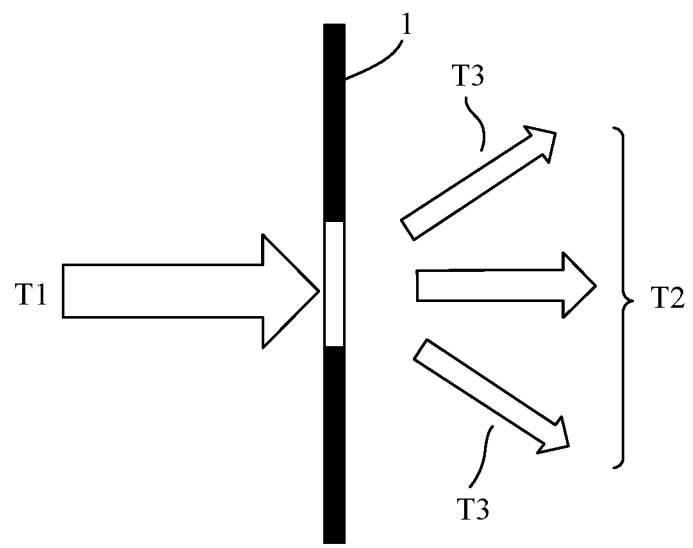
FIG. 1 is a schematic diagram showing a path of light through a transparent display, in accordance with some embodiments.

Whether scenes behind a transparent display can be seen clearly is related to the transmittance and the haze of the transparent display. The higher the transmittance is and the lower the haze is, the clearer and brighter the scenes that can be seen through the transparent display are. Referring to FIG. 1, the transmittance Tr is a ratio of transmitted light T2 transmitted through the transparent display 1 to incident light T1. That is, Tr is equal to a quotient of T2 and T1 (i.e., Tr=T2/T1). The haze refers to a percentage of an intensity $\Phi_{T3}$ of transmitted light T3 that deviated from the incident light T1 by an angle of more than 2.5° to an total intensity $\Phi_{T2}$ of the transmitted light T2. That is, the haze is equal to a quotient of $\Phi_{T3}$ and $\Phi_{T2}$ (i.e., haze=$\Phi_{T3}/\Phi_{T2}$).

The larger light transmission area the transparent display has, the higher the transmittance of the transparent display is. The more reflective metal the transparent display has (that is, the more the light is scattered), the greater the haze of the transparent display is. Therefore, in order to see the scenes behind the transparent display 1 clearly, a large light transmission region with a small amount of metal lines needs to be designed in each sub-pixel of the transparent display 1.

Figure 2:
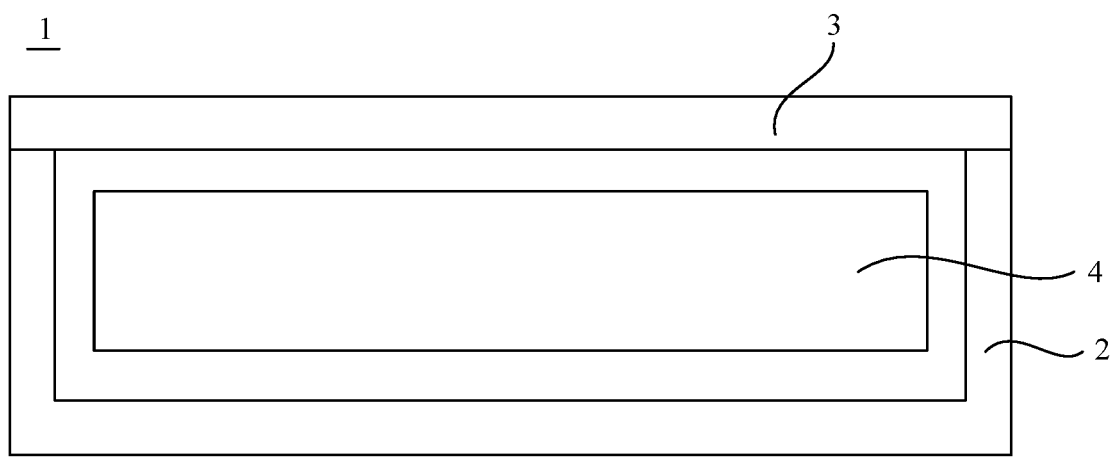
FIG. 2 is a schematic diagram showing a structure of a transparent display, in accordance with some embodiments.

Some embodiments of the present disclosure provide a transparent display. As shown in FIG. 2, the transparent display 1 includes at least a frame 2, a cover sheet 3 (for example, a glass cover sheet), a transparent display panel 4, and other electronic components. A longitudinal section of the frame 2 is U-shaped, and thus has a chamber. The transparent display panel 4 and other electronic components are all disposed in the chamber. The cover sheet 3 is disposed on a display side of the transparent display panel 4.

Figure 3:
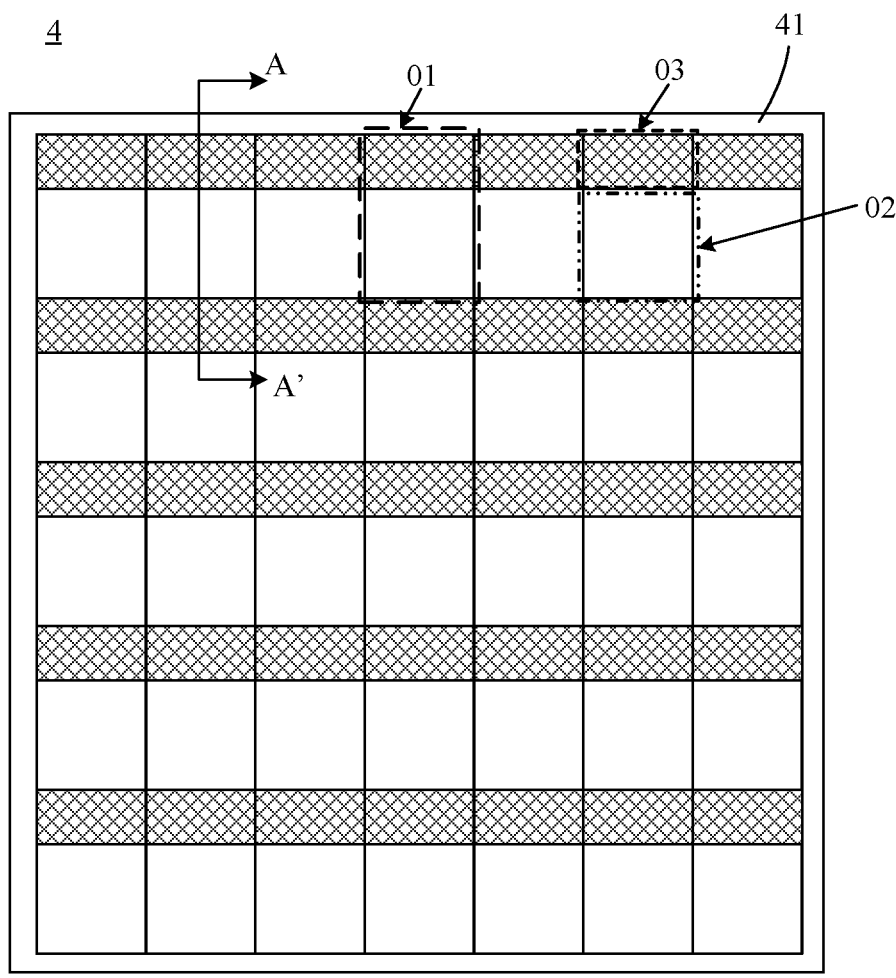
FIG. 3 is a top view of a transparent display panel, in accordance with some embodiments.
Figure 4:
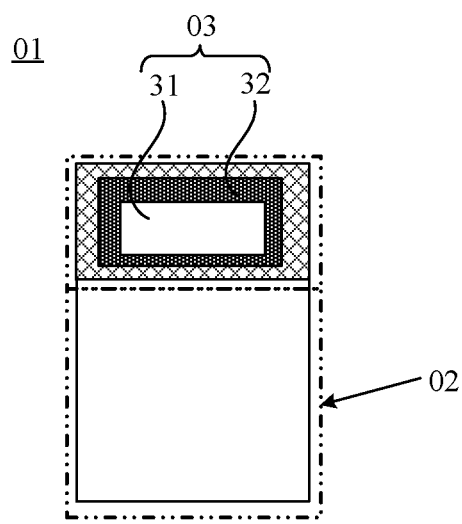
FIG. 4 is a schematic diagram showing a structure of a sub-pixel, in accordance with some embodiments.

In some embodiments, as shown in FIGS. 3 and 4, the transparent display panel 4 includes a base 41, and a plurality of sub-pixels 01 disposed on the base 41. Each sub-pixel 01 includes a light-emitting unit 03, and a light transmission portion 02 disposed on at least one side of the light-emitting unit 03. The light-emitting unit 03 includes at least one micro light-emitting diode (Micro-LED) 31 (the Micro-LED also referred to as a Micro-LED chip or a Micro-LED die) and a control circuit 32. The control circuit 32 is coupled to the at least one Micro-LED 31 and is configured to drive the at least one Micro-LED 31 to emit light. The light-transmitting portion 02 includes at least one of a transparent insulating portion or an opening.

It will be understood that the light transmission portion 02 has a high transmittance, and thus external ambient light can pass through the light transmission portion 02. The light transmission portion 02 includes at least one of the transparent insulating portion or the opening, and thus the transmittance of the light transmission portion 02 may reach about 98%. In addition, it is difficult for the external ambient light to pass through a region in which the light-emitting unit 03 is located, since the light-emitting unit 03 is opaque or has a low transmittance (e.g., less than 10%).

Since the Micro-LED has a high brightness, a long service life, and a light-emitting efficiency that increases as the brightness increases, the transparent display panel 4 may have a high brightness, a high contrast and a long service life. Therefore, when the transparent display panel 4 displays an image, and the external ambient light on both sides illuminates the image displayed on the transparent display panel 4, the brightness of the transparent display panel 4 may be higher (when compared to an ordinary display panel) to reach a high contrast, thereby ensuring a good display effect.

Here, in each sub-pixel 01, sizes of an area of an orthographic projection of the light transmission portion 02 on the base 41 and an area of an orthographic projection of the light-emitting unit 03 on the base 41 are not limited. The larger the area of the orthographic projection of the light transmission portion 02 is, the higher the transmittance of the transparent display panel 4 is and the clearer the scenes that are seen through the transparent display panel 4 are.

In addition, because of the high brightness of the Micro-LED, the light-emitting unit 03 may have high brightness, and thus the ratio of the area of the light-emitting unit 03 to the area of the sub-pixel 01 may be decreased. Therefore, the area of the light transmission portion 02 may be increased, which means that the sub-pixel 01 may allow more light to pass through, so that the transmittance of the transparent display panel 4 may be increased.

For example, as shown in FIG. 3, in each sub-pixel 01, the area of the orthographic projection of the light transmission portion 02 is larger than the area of the orthographic projection of the light-emitting unit 03.

If the area of the light transmission portion 02 in each sub-pixel 01 are too large, the area of the light-emitting unit 03 will be too small. In other words, the luminous area of the transparent display panel 4 including light-emitting units 03 is small, which may cause a low brightness of the transparent display panel 4. Therefore, in some examples, the area of the orthographic projection of the light transmission portion 02 on the base 41 is one to three times the area of the orthographic projection of the light-emitting unit 03 on the base 41. In this case, images displayed on the transparent display panel 4 may be seen clearly, as well as the scenes behind the transparent display panel 4.

For example, the area of the orthographic projection of the light transmission portion 02 is equal to the area of the orthographic projection of the light-emitting unit 03, or is 1.5 times, 2 times, 2.5 times, or 3 times the area of the orthographic projection of the light-emitting unit 03.

Of course, in actual production of the transparent display panel 4, a ratio of the area of the orthographic projection of the light transmission portion 02 to the area of the orthographic projection of the light-emitting unit 03 may be properly set according to actual requirements. In addition, the areas of orthographic projections of the light transmission portions 02 in different sub-pixels 01 may be the same or not.

In some examples, a material of the base 41 is an insulating material. For example, the base 41 is a glass base.

Figure 5:
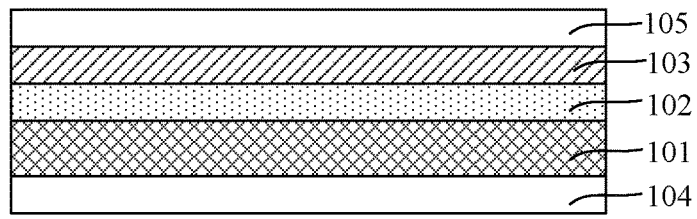
FIG. 5 is a schematic diagram showing a structure of a Micro-LED, in accordance with some embodiments.
Figure 6:
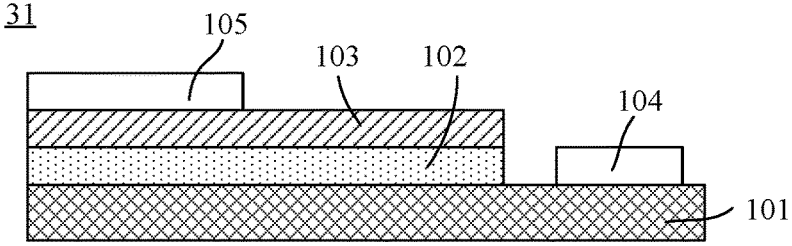
FIG. 6 is a schematic diagram showing a structure of another Micro-LED, in accordance with some embodiments.

In some examples, as shown in FIGS. 5 and 6, the Micro-LED 31 includes a P-type semiconductor layer 101, an N-type semiconductor layer 103, and a light-emitting layer 102 disposed therebetween. The Micro-LED 31 further includes a first electrode 104 in contact with the P-type semiconductor layer 101 and a second electrode 105 in contact with the N-type semiconductor layer 103. The structure of the Micro-LED 31 is not limited thereto, and one or more layers may be added into the Micro-LED 31.

For example, as shown in FIG. 5, the first electrode 104 is disposed on a surface of the P-type semiconductor pattern 101 facing away from the N-type semiconductor pattern 103. The second electrode 105 is disposed on a surface of the N-type semiconductor pattern 103 facing away from the P-type semiconductor pattern 101. In this case, the first electrode 104 and the second electrode 105 are located on two opposite sides of the P-type semiconductor pattern 101.

In some other examples, as shown in FIG. 6, the first electrode 104 is disposed on a surface of the P-type semiconductor pattern 101 facing the N-type semiconductor pattern 103. The second electrode 105 is disposed on a surface of the N-type semiconductor pattern 103 facing away from the P-type semiconductor pattern 101. In addition, there is a distance between orthographic projections of the first electrode 104 and the second electrode 105 on the P-type semiconductor pattern 101. In this case, the first electrode 104 and the second electrode 105 are disposed on a same side of the P-type semiconductor pattern 101.

The materials of the P-type semiconductor layer 101, the light-emitting layer 102 and the N-type semiconductor layer 103 may be the same, for example, gallium nitride (GaN). However, the materials of the P-type semiconductor layer 101, the light-emitting layer 102 and the N-type semiconductor layer 103 are not limited thereto, and can be selected according to actual needs. In addition, the light-emitting layer 102 has, for example, a multiple quantum well structure.

In some embodiments, the transparent display panel 4 is configured to implement black-and-white display. All Micro-LEDs in the transparent display panel 4 are white Micro-LEDs which can emit white light.

In some other embodiments, the transparent display panel 4 is configured to implement color display, and the Micro-LEDs in the transparent display panel 4 include at least red (R) Micro-LEDs, green (G) Micro-LEDs and blue (B) Micro-LEDs.

In addition, one of the first electrode 104 and the second electrode 105 in each Micro-LED is electrically connected to the control circuit 32, while another is electrically connected to a metal wire (e.g., a common electrode line). The control circuit 32 is further connected to some metal wires (e.g., a scanning signal line, a data signal line, a power supply voltage line, and the like) to receive scanning signals, data signals, and the like.

Figure 9:
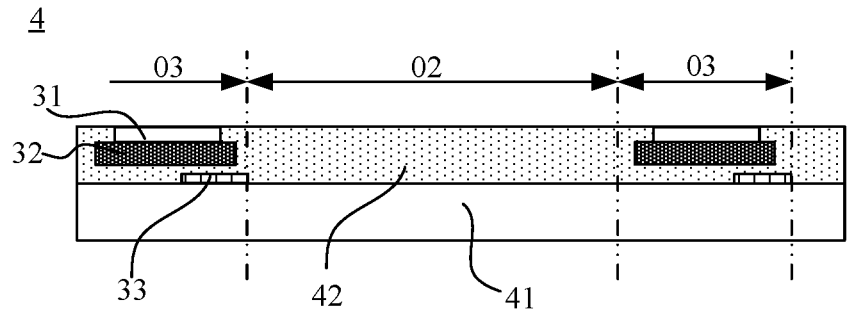
FIG. 9 is a schematic section of another transparent display panel shown in FIG. 3 along the A-A' line.

In some embodiments, referring to FIG. 9, the transparent display panel 4 further includes a plurality of metal wires 33 disposed in at least one layer between the Micro-LED 31 and the base 41. For example, the metal wires 33 include at least one type of signal line of scanning signal lines, data signal lines, high-voltage signal lines or low-voltage signal lines. In addition, an orthographic projection of the plurality of metal wires 33 on the base 41 does not overlap the orthographic projection of the light transmission portion 02 on the base 41. For example, the plurality of metal wires 33 are disposed in a region in which the light-emitting unit 03 is located, and at a boundary between the light transmission portion 02 and the light-emitting unit 03.

In this way, the metal wires may be prevented from blocking the light, which increases the transmittance of the transparent display panel 4. In addition, the scattering of the light by the metal wires may be prevented, which reduces the haze of the transparent display panel 4. As a result, the scenes seen through the transparent display panel 4 may be clear.

In some embodiments, the control circuit 32 has a same structure as a pixel driving circuit of the sub-pixel in an OLED display panel. For example, the control circuit 32 is a pixel driving circuit with a 2T1C structure, a 6T1C structure, or a 7T1C structure (with regard to structures thereof, reference may be made to the related technologies). Here, T refers to a transistor and C refers to a capacitor. For example, "a pixel driving circuit with a 2T1C structure" refers to a pixel driving circuit composed of two transistors and one capacitor. Similarly, "6T1C" refers to six transistors and one capacitor, and "7T1C" refers to seven transistors and one capacitor.

The control circuit 32 will be illustrated below in detail by taking an example in which the control circuit 32 is the pixel driving circuit with the 2T1C structure.

Figure 7:
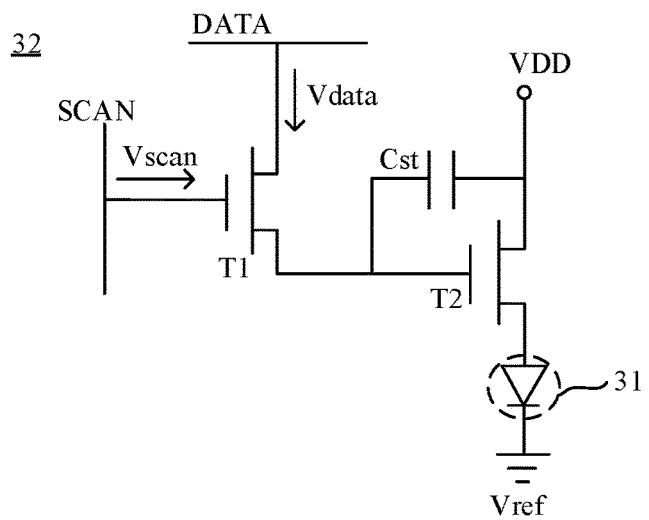
FIG. 7 is a schematic circuit diagram of a control circuit, in accordance with some embodiments.

As shown in FIG. 7, the control circuit 32 includes a switching transistor T1, a driving transistor T2 and a capacitor Cst. A gate of the switching transistor T1 is electrically connected to a scanning signal line SCAN, a first electrode of the switching transistor T1 is electrically connected to a data signal line DATA, and a second electrode of the switching transistor T1 is electrically connected to a first electrode of the capacitor Cst. A gate of the driving transistor T2 is electrically connected to the first electrode of the capacitor Cst, a first electrode of the driving transistor T2 is electrically connected to a first voltage terminal VDD, and a second electrode of the driving transistor T2 is electrically connected to a first electrode of the Micro-LED 31. A second electrode of the capacitor Cst is electrically connected to the first voltage terminal VDD. A second electrode of the Micro-LED 31 is electrically connected to a second voltage terminal Vref.

During an image frame, the process of driving the Micro-LED 31 includes an input phase and a light-emitting phase.

In the input phase, the scanning signal line SCAN provides a scanning signal Vscan to control the switching transistor T1 to be turned on, and a data signal Vdata provided by the data signal line DATA is written into the capacitor Cst via the switching transistor T1. That is, the capacitor Cst is charged in the input phase.

In the light-emitting phase, the capacitor Cst discharges to control the driving transistor T2 to be turned on, and a voltage provided via the first voltage terminal VDD is transmitted to the first electrode of the Micro-LED 31 via the driving transistor T2. The second electrode of the Micro-LED 31 is electrically connected to the second voltage terminal Vref, and thus the Micro-LED 31 is driven to emit light by voltages provided via the first voltage terminal VDD and the second voltage terminal Vref.

For example, the first electrode of the switching transistor T1 and the first electrode of the driving transistor T2 are sources, and the second electrode of the switching transistor T1 and the second electrode of the driving transistor T2 are drains. For another example, the first electrode of the switching transistor T1 and the first electrode of the driving transistor T2 are drains, and the second electrode of the switching transistor T1 and the second electrode of the driving transistor T2 are sources. The first voltage terminal VDD may be a high voltage terminal, and the second voltage terminal Vref may be a low voltage terminal.

Of course, the structure of the control circuit 32 is not limited thereto, and other circuit structures with similar functions may also be applicable for the control circuit 32. It will be understood that no matter what circuit structure is used, the control circuit 32 should include at least two transistors (a switching transistor and a driving transistor).

Some embodiments of the present disclosure do not limit the type of the transistors. For example, the transistors include at least one of an oxide thin film transistor or a low temperature poly-silicon thin film transistor (abbreviated as LTPS TFT). That is, all the transistors in the control circuit 32 are oxide thin film transistors, or all the transistors are low temperature poly-silicon thin film transistors, or at least one of the transistors is the oxide thin film transistor and the remaining transistor(s) are low temperature poly-silicon thin film transistor(s).

The oxide thin film transistor and the low temperature poly-silicon thin film transistor have high mobility rate and may output a large current, which may make the transparent display panel 4 achieve a high brightness and a high contrast.

For example, the oxide thin film transistor is an indium gallium zinc oxide (abbreviated as IGZO) thin film transistor or a zinc tin oxide (abbreviated as ZnSnO) thin film transistor.

In addition, the transistor may be a bottom-gate thin film transistor or a top-gate thin film transistor.

Figure 10:
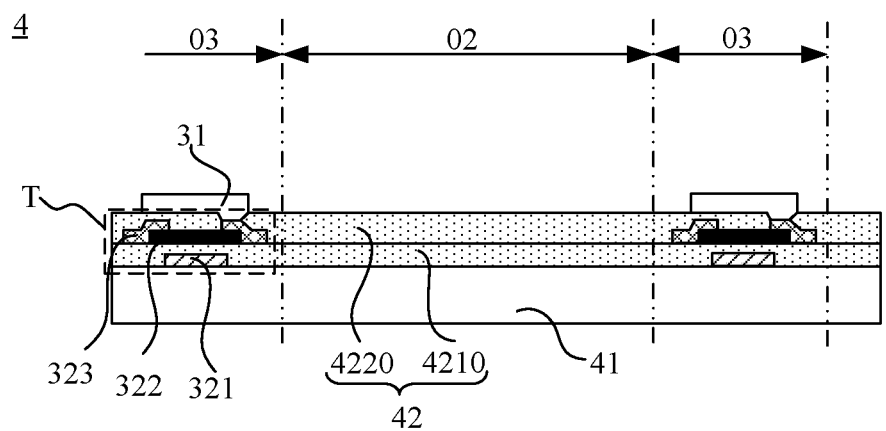
FIG. 10 is a schematic section of yet another transparent display panel shown in FIG. 3 along the A-A' line.

In some examples, the transistors in the control circuit 32 are bottom-gate thin film transistors. As shown in FIG. 10, the transparent display panel 4 includes a base 41, and gate patterns 321, a gate insulating layer 4210, active patterns 322, source-drain patterns 323 (each including a source and a drain) and a planarization layer 4220 stacked on the base 41. The source and the drain of each transistor T are electrically connected to a corresponding active pattern 322.

In some other examples, the transistors are top-gate thin film transistors.

Figure 11:
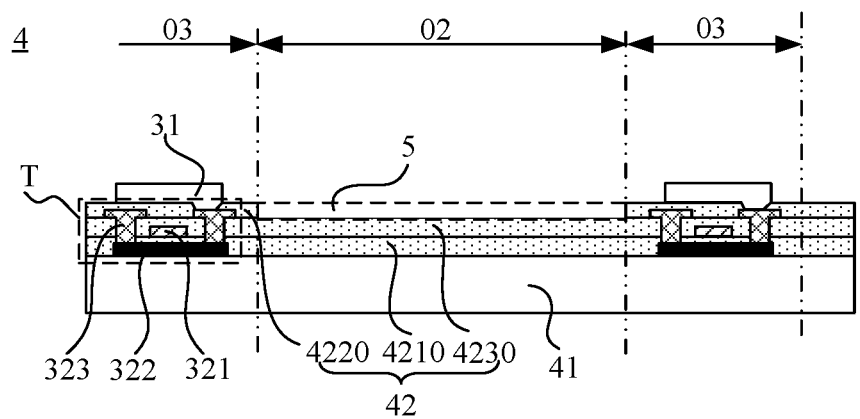
FIG. 11 is a schematic section of yet another transparent display panel shown in FIG. 3 along the A-A' line.

As shown in FIG. 11, the transparent display panel 4 includes a base 41, and active patterns 322, a gate insulating layer 4210, gate patterns 321, an interlayer insulating layer 4230, source-drain patterns 323 (each including a source and a drain) and a planarization layer 4220 stacked on the base 41. the transparent display panel 4 further includes via holes passing through the gate insulating layer 4210 and the interlayer insulating layer 4230, and the source and the drain of each transistor T are electrically connected to the active pattern 322 via corresponding via holes.

For example, materials of the gate insulating layer 4210 and the interlayer insulating layer 4230 include at least one of silicon nitride (SiNx), silicon oxide (SiOx), or silicon oxynitride (SiOxNy).

That "the light transmission portion 02 includes at least one of a transparent insulating portion or an opening" has various implementations.

Figure 8:
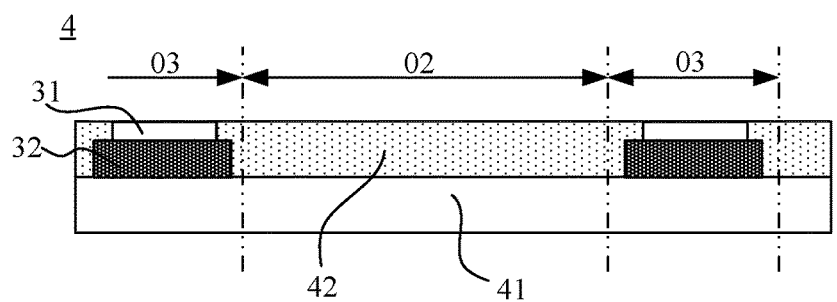
FIG. 8 is a schematic section of the transparent display panel shown in FIG. 3 along the A-A' line.

In some examples, as shown in FIGS. 8 and 9, the transparent display panel 4 includes a base 41 and at least one insulating layer 42 disposed on the base 41. Materials of the base 41 and the at least one insulating layer 42 are transparent inorganic insulating materials. The light transmission portion 02 in each sub-pixel is a the transparent insulating portion composed of a portion of the at least one insulating layer 42.

The inorganic insulating material is, for example, silicon nitride, silicon oxide, silicon oxynitride or the like.

Since the inorganic insulating materials can form a layer with a small thickness, the base 41 and the at least one insulating layer 42 with small thicknesses may be implemented. In this way, a thin and light design for the transparent display panel 4 may be implemented. In addition, since the thickness of the at least one insulating layer 42 may be small, the thickness of the light transmission portion 02 may be small, which increases the transmittance of the light transmission portion 02.

For example, as showed in FIGS. 10 and 11, the at least one insulating layer 42 includes a plurality of insulating layers. The plurality of insulating layers may include at least one of the gate insulating layer 4210 or the interlayer insulating layer 4230. In a case where the transparent display panel 4 further includes a buffer layer, a barrier layer and the like, the plurality of insulating layers may further include at least one of the buffer layer or the barrier layer. The structure of the at least one insulating layer 42 is not limited thereto.

As shown in FIGS. 10 and 11, there may be metal patterns, such as gate patterns 321, between two adjacent insulating layers 42, and the metal patterns are disposed in a region in which the light-emitting unit 03 is located. In addition, the two adjacent insulating layers 42 are in direct contact in a region in which the light transmission portion 02 is located.

Figure 12:
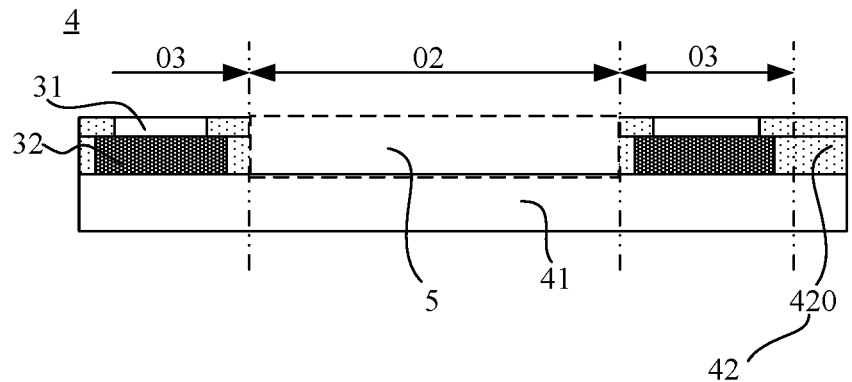
FIG. 12 is a schematic section of yet another transparent display panel shown in FIG. 3 along the A-A' line.
Figure 13:
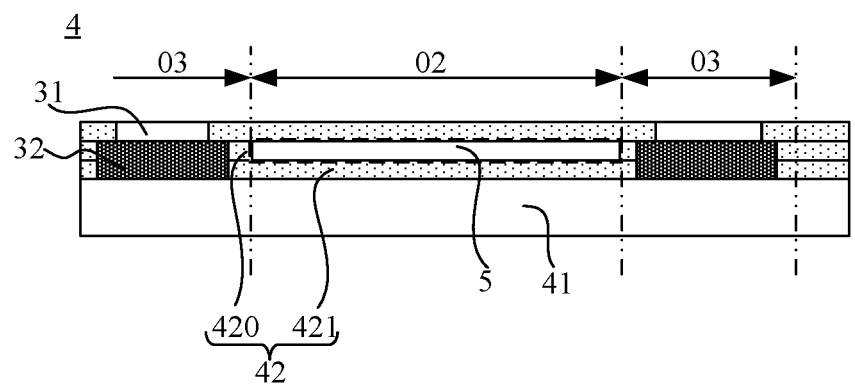
FIG. 13 is a schematic section of yet another transparent display panel shown in FIG. 3 along the A-A' line.

In some other examples, as shown in FIGS. 12 and 13, the transparent display panel 4 includes a base 41 and at least one insulating layer 42 disposed on the base 41. The at least one insulating layer 42 includes at least one organic insulating layer 420. Here, materials of the at least one organic insulating layer 420 may include Polyimide. The at least one organic insulating layer 420 includes a plurality of openings 5 each disposed in a respective one of the plurality of sub-pixels 01. That is, the at least one organic insulating layer 420 is removed at a position corresponding to each light transmission portion 02 to form the opening 5.

For example, as shown in FIG. 12, the at least one insulating layer 42 only includes at least one organic insulating layer 420. In this case, the light transmission portion 02 in each sub-pixel 01 is composed of an opening 5 in the at least one organic insulating layer 420.

In this case, an orthographic projection of the opening 5 on the base 41 completely overlaps the orthographic projection of the light transmission portion 02 on the base 41.

For example, the transparent display panel 4 includes a planarization layer, a pixel defining layer and the like, and the at least one organic insulating layer 420 may include at least one of the planarization layer or the pixel defining layer.

For another example, as shown in FIG. 13, the at least one insulating layer 42 includes at least one organic insulating layer 420 and at least one inorganic insulating layer 421 stacked on the base 41, and materials of the at least one insulating layer 421 are transparent inorganic insulating materials. Thus, the light transmission portion 02 in each sub-pixel 01 is composed of an opening 5 in the at least one organic insulating layer 420 and a transparent insulating portion composed of a portion of the at least one inorganic insulating layer 421.

For example, the transparent display panel 4 includes a gate insulating layer and a interlayer insulating layer and the like, and the at least one inorganic insulating layer 421 may include at least one of the gate insulating layer and the interlayer insulating layer.

The at least one organic insulating layer 420 may include one organic insulating layer 420 or a plurality of organic insulating sub-layers stacked. The at least one inorganic insulating layer 421 may include one inorganic insulating layer 421 or a plurality of inorganic insulating sub-layers stacked.

In addition, in a case where the at least one insulating layer 42 includes the organic insulating layer 420 and the inorganic insulating layer 421, the organic insulating layer 420 may be proximate to the base 41 relative to the inorganic insulating layer 421, or the inorganic insulating layer 421 may be proximate to the base 41 relative to the organic insulating layer 420.

For example, the at least one organic insulating layer 420 includes a plurality of organic insulating sub-layers, the at least one inorganic insulating layer 421 includes a plurality of inorganic insulating sub-layers, and the plurality of organic insulating sub-layers and the plurality of inorganic insulating sub-layers are alternately arranged along the thickness direction of the base 41.

It will be noted that a thickness of each organic insulating layer 420 may be set to be large due to the manufacturing process, which may affect the transmittance of the light transmission portion 02. However, in the embodiments of the present disclosure, the openings 5 are provided in the organic insulating layer 420, which may make the light transmission portion 02 be composed of the openings 5, or be composed of both the openings 5 and the transparent insulating portion. As a result, whether the thickness of the organic insulating layer 420 is large may have no influence on the transmittance of the light transmission portion 02.

Figure 14:
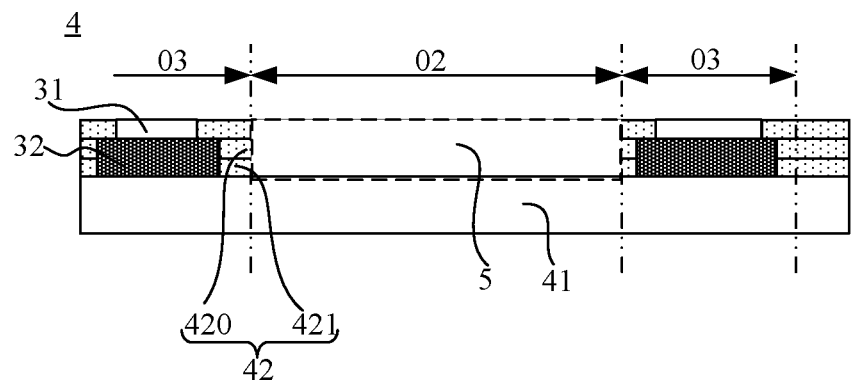
FIG. 14 is a schematic section of yet another transparent display panel shown in FIG. 3 along the A-A' line.

In some other examples, as shown in FIG. 14, the transparent display panel 4 includes a base 41 and at least one insulating layer 42 disposed on the base 41. The at least one insulating layer 42 includes a plurality of openings 5 each disposed in a respective one of the plurality of sub-pixels 01. The light transmission portion 02 in each sub-pixel 01 is composed of an opening 5.

For example, the transparent display panel 4 includes a gate insulating layer, a interlayer insulating layer, a planarization layer and the like, and the at least one insulating layer 42 may include the gate insulating layer, the interlayer insulating layer and the planarization layer.

In this case, an orthographic projection of the opening 5 on the base 41 completely overlaps the orthographic projection of the light transmission portion 02 on the base 41.

In this way, the absorbing of light by the insulating layer 42 may be reduced due to the opening 5, which further improves the transmittance of the light transmission portion 02. In addition, the transmittance of a region of the transparent display panel 4 corresponding to the light transmission portion 02 may be equal to the transmittance of the base 41, and thus may be very close to 100%.

The at least one insulating layer 42 includes, for example, at least one of an organic insulating layer or an inorganic insulating layer.

In addition, the at least one insulating layer 42 may include one insulating layer 42 or a plurality of insulating layers 42.

In the description of the foregoing embodiments, specific features, structures, materials or characteristics may be combined in a suitable manner in any one or more embodiments or examples.

The forgoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A transparent display panel, comprising:
   a base; and
   a plurality of sub-pixels disposed on the base, each sub-pixel including:
   a light-emitting unit including at least one micro light-emitting diode (Micro-LED) and a control circuit connected to the at least one Micro-LED, the control circuit being configured to drive the at least one Micro-LED to emit light;
   a light transmission portion disposed on at least one side of the light-emitting unit, the light transmission portion including at least one of a transparent insulating portion or an opening, wherein an area of the orthographic projection of the light transmission portion on the base is two to three times an area of the orthographic projection of the light-emitting unit on the base; and
   at least one insulating layer disposed on the base, wherein the at least one insulating layer includes a plurality of openings each disposed in a respective one of the plurality of sub-pixels; and the openings penetrate through the at least one insulating layer at corresponding positions.

2. The transparent display panel according to claim 1, wherein
the at least one insulating layer includes at least one organic insulating layer including the plurality of openings each disposed in the respective one of the plurality of sub-pixels;
the light transmission portion includes a corresponding opening; and
the openings penetrate through the at least one organic insulating layer at the corresponding positions.

3. The transparent display panel according to claim 2, wherein the at least one insulating layer further includes at least one inorganic insulating layer, and materials of the base and the at least one inorganic insulating layer are transparent inorganic insulating materials; and
the light transmission portion further includes the transparent insulating portion composed of a portion of the at least one inorganic insulating layer.

4. The transparent display panel according to claim 1, wherein
the at least one insulating layer includes at least one organic insulating layer and at least one inorganic insulating layer;
the openings penetrate through all the insulating layers at the corresponding positions; and
the light transmission portion is composed of a corresponding opening.

5. The transparent display panel according to claim 1, further comprising a plurality of metal wires disposed in at least one layer between the at least one Micro-LED and the base, wherein an orthographic projection area of the plurality of metal wires on the base does not overlap an orthographic projection area of the light transmission portion on the base.

6. The transparent display panel according to claim 1, wherein the control circuit includes at least one of an oxide thin film transistor or a low temperature poly-silicon thin film transistor.

7. The transparent display panel according to claim 1, wherein the control circuit includes a switching transistor, a driving transistor and a capacitor;
a gate of the switching transistor is electrically connected to a scanning signal line, a first electrode of the switching transistor is electrically connected to a data signal line, and a second electrode of the switching transistor is electrically connected to a first electrode of the capacitor;
a gate of the driving transistor is electrically connected to the first electrode of the capacitor, a first electrode of the driving transistor is electrically connected to a first voltage terminal, and a second electrode of the driving transistor is electrically connected to a first electrode of a corresponding Micro-LED; and
a second electrode of the capacitor is electrically connected to the first voltage terminal.

8. The transparent display panel according to claim 1, wherein each Micro-LED includes:
a P-type semiconductor layer, a light-emitting layer, and an N-type semiconductor layer which are stacked;
a first electrode in contact with the P-type semiconductor layer; and
a second electrode in contact with the N-type semiconductor layer.

9. A transparent display, comprising the transparent display panel according to claim 1.

* * * * *